United States Patent
Ogasahara et al.

(10) Patent No.: US 11,925,121 B2
(45) Date of Patent: Mar. 5, 2024

(54) PIEZOELECTRIC ELEMENT HAVING EXCELLENT FLEXIBILITY AND BEND RESISTANCE

(71) Applicant: TOHO KASEI CO., LTD., Nara (JP)

(72) Inventors: Ken Ogasahara, Nara (JP); Satoshi Shimizu, Nara (JP); Susumu Kawato, Nara (JP); Kousuke Nishikawa, Nara (JP)

(73) Assignee: TOHO KASEI CO., LTD., Nara (JP)

( * ) Notice: Subject to any disclaimer, the term of this patent is extended or adjusted under 35 U.S.C. 154(b) by 507 days.

(21) Appl. No.: 17/272,737

(22) PCT Filed: Aug. 1, 2019

(86) PCT No.: PCT/JP2019/030242
§ 371 (c)(1),
(2) Date: Mar. 2, 2021

(87) PCT Pub. No.: WO2020/049912
PCT Pub. Date: Mar. 12, 2020

(65) Prior Publication Data
US 2021/0351337 A1   Nov. 11, 2021

(30) Foreign Application Priority Data
Sep. 6, 2018 (JP) .................. 2018-167231

(51) Int. Cl.
*H10N 30/60* (2023.01)
*H10N 30/857* (2023.01)
*H10N 30/88* (2023.01)
(52) U.S. Cl.
CPC .......... *H10N 30/60* (2023.02); *H10N 30/857* (2023.02); *H10N 30/883* (2023.02)

(58) Field of Classification Search
CPC .... H10N 30/60; H10N 30/857; H10N 30/883; H10N 30/30; H10N 30/87
See application file for complete search history.

(56) References Cited

U.S. PATENT DOCUMENTS

| | | | |
|---|---|---|---|
| 6,271,621 B1 | 8/2001 | Ito et al. | |
| 11,402,282 B2 * | 8/2022 | Yoshida | ................... H02N 2/00 |
| 2019/0109274 A1 | 4/2019 | Ogasahara et al. | |

FOREIGN PATENT DOCUMENTS

| | | |
|---|---|---|
| JP | 2001004462 A | 1/2001 |
| JP | 2007-10324 | 1/2007 |

(Continued)

OTHER PUBLICATIONS

International Search Report (English) and Written Opinion dated Oct. 15, 2019, from International Application No. PCT/JP2019/030242, 8 pages.

(Continued)

*Primary Examiner* — Emily P Pham
(74) *Attorney, Agent, or Firm* — Meunier Carlin & Curfman LLC

(57) ABSTRACT

Provided is a novel piezoelectric element that has a generally long linear shape and has excellent flexibility and bend resistance. The piezoelectric element includes a core wire which is a resin wire having at least one layer of metal foil helically wound therearound, an organic piezoelectric layer that coats the core wire, and a conductor layer that coats the organic piezoelectric layer. The metal foil and the conductor layer each function as an electrode having the organic piezoelectric layer interposed therebetween. The at least one layer of metal foil is helically wound around the resin wire with gaps, and the ratio of the gap to the helical pitch of the metal foil is 0.4% to 50%.

9 Claims, 4 Drawing Sheets

(56) References Cited

FOREIGN PATENT DOCUMENTS

| JP | 2017-183570 | 10/2017 |
| JP | 2017-188538 | 10/2017 |

OTHER PUBLICATIONS

Online catalog "Piezo Film Product Information", p. 15, "Piezopolymer coaxial cable", [online], Apr. 2012, Tokyo Sensor Co., Ltd., [retrieved Aug. 23, 2018], Internet URL:http://www.t-sensor.co.jp/catalog/PIEZO2012.pdf.

* cited by examiner (a)

(b)

(c)

(a)

(b)

(c)

PIEZOELECTRIC ELEMENT HAVING EXCELLENT FLEXIBILITY AND BEND RESISTANCE

TECHNICAL FIELD

The present invention relates to a piezoelectric element, and more particularly to a piezoelectric element having an elongated linear form as a whole, which may be referred to as a cable shape, a wire shape, or the like.

BACKGROUND ART

Piezoelectric elements are elements using piezoelectric bodies and they have been used in various applications, for example, as a sensor by utilizing the positive piezoelectric effect of the piezoelectric body (converting external force applied to the piezoelectric body into voltage) or as an actuator by utilizing the inverse piezoelectric effect of the piezoelectric body (converting voltage applied to the piezoelectric body into force).

Among such piezoelectric elements, a coaxial cable-shaped piezoelectric element has been conventionally known as a piezoelectric element having an elongated linear form as a whole. For example, Non-Patent Literature 1 discloses a piezoelectric cable that has a configuration in which a PVDF piezoelectric film tape (a piezoelectric body) is helically wound around a core wire (an inner conductor), covered with a copper braided wire (an outer conductor), and further coated with a polyethylene outer shell. Patent Literature 1 discloses a piezoelectric wire including a conductive wire, a polymer piezoelectric layer coating the conductive wire, and a conductor layer disposed on an outer surface of the polymer piezoelectric layer, wherein the polymer piezoelectric layer contains a β-type polyvinylidene fluoride-based copolymer, and wherein the wire diameter of the conductive wire is 1.0 mm or less.

CITATION LIST

Patent Literature

Patent Literature 1: JP 2017-183570 A

Non-Patent Literature

Non-Patent Literature 1: Online catalog "PIEZO FILM PRODUCT INFORMATION", p.15, "Piezopolymer coaxial cable", (online), April 2012, Tokyo Sensor Co., Ltd., [retrieved Aug. 23, 2018], Internet URL:http://www.t-sensor.co.jp/catalog/PIEZO2012.pdf

SUMMARY OF INVENTION

Technical Problem

However, the piezoelectric cable mentioned in the Non-Patent Literature 1 uses a stranded metal wire (with a wire diameter of 1.02 mm) as the core wire, and the wire diameter of the overall cable, including the polyethylene outer shell, is 2.67 mm. Although such a piezoelectric cable is flexible, it is still hard, and thus when bent at a small radius of curvature, distortion can remain in the core wire. Moreover, when bent repeatedly, the core wire can break to thereby cut off the conduction. Consequently, the piezoelectric cable becomes unable to function as a piezoelectric element. In addition, the piezoelectric wire mentioned in Patent Literature 1 is flexible, but uses a single or stranded metal wire as the core wire (paragraphs 0045 and 0050 of Patent Literature 1), which is not necessarily sufficient in terms of flexibility and bending resistance.

The present invention has been made in view of the above-mentioned problems, and an object of the present invention is to provide a novel piezoelectric element that has an elongated linear form as a whole and also has excellent flexibility and bending resistance.

Solution to Problem

According to the present invention, a piezoelectric element is provided which includes:
a core wire which is formed by winding at least one layer of metal foil helically around a resin wire,
an organic piezoelectric layer which coats the core wire, and
a conductor layer which coats the organic piezoelectric layer,
wherein,
the metal foil and the conductor layer each function as an electrode having the organic piezoelectric layer interposed therebetween, the at least one layer of metal foil is helically wound around the resin wire with gaps, and a ratio of the gap to a helical pitch of the metal foil is 0.4 to 501.

That is, according to the present invention, the piezoelectric element uses the core wire formed by winding at least one layer of metal foil helically around the resin wire, and is configured by coating this core wire with the organic piezoelectric layer and further coating the organic piezoelectric layer with the conductor layer. Such a piezoelectric element of the present invention can be configured as a piezoelectric element that has an elongated linear form as a whole. Since the piezoelectric element of the present invention uses the core wire formed by winding at least one layer of metal foil helically around the resin wire, distortion is less likely to remain in the core wire even when bent at a small radius of curvature and thus this piezoelectric element has excellent flexibility, furthermore, the core wire is less likely to break to cut off the conduction when bent repeatedly and thus it also has excellent bending resistance.

In one aspect of the present invention, two or more layers of metal foil may be wound helically around the resin wire.

In another aspect of the present invention, the resin wire may be composed of at least one material selected from the group consisting of aromatic polyamide, aliphatic polyamide, polyester, polyvinyl alcohol, polyacrylonitrile, polyarylate, polyolefin, polyurethane, and carbon fiber.

In another aspect of the present invention, the metal foil can have a thickness of 6 to 100 μm and/or a width of 0.02 to 2 mm.

In another aspect of the present invention, the core wire can have an external dimension of 0.05 to 1.5 mm.

In another aspect of the present invention, the organic piezoelectric layer can have a thickness of 1 to 200 μm.

In another aspect of the present invention, the organic piezoelectric layer can include at least one selected from the group consisting of copolymer of vinylidene fluoride and trifluoroethylene, and copolymer of vinylidene fluoride and tetrafluoroethylene.

In another aspect of the present invention, the piezoelectric element may further include an insulator layer which coats the conductor layer.

The piezoelectric element of the present invention can be used as, for example, a sensor or an actuator, or both of them.

Advantageous Effects of Invention

Accordingly, the present invention provides the novel piezoelectric element that has an elongated linear form as a whole and also has excellent flexibility and bending resistance.

BRIEF DESCRIPTION OF DRAWINGS

FIGS. 1(a) to (c) are schematic diagrams showing a piezoelectric element in one embodiment of the present invention, in which FIG. 1(a) shows a side view of a part cut out of the piezoelectric element, FIG. 1(b) shows a sectional view taken along line A-A of FIG. 1(a), and FIG. 1(c) shows a modified example of FIG. 1(b).

FIGS. 2(a) to (c) are schematic diagrams showing a core wire usable for the piezoelectric element in one embodiment of the present invention, in which FIG. 2(a) shows a side view of the core wire, FIG. 2(b) shows a sectional view taken along line B-B of FIG. 1(a), and FIG. 2(c) shows a modified example of FIG. 1(b).

DESCRIPTION OF EMBODIMENTS

An embodiment of the present invention will be described in detail below with reference to the drawings. In the appending drawings, electrode terminals are shown schematically by black circles.

Figure 1:
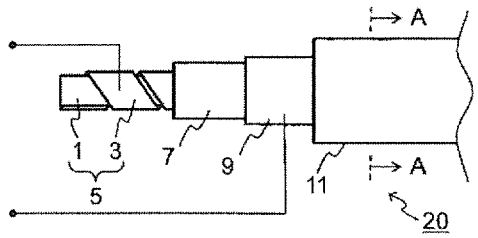
Figure 1:
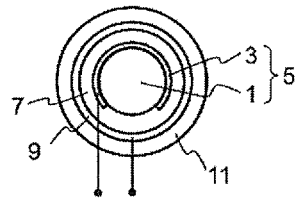
Figure 1:
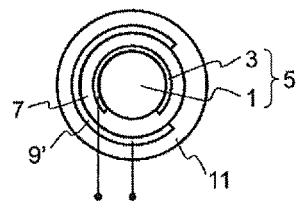

Referring to FIG. 1, a piezoelectric element 20 of a present embodiment includes: a core wire 5 which is formed by winding at least one layer of metal foil 3 helically around a resin wire 1, an organic piezoelectric layer 7 which coats the core wire 5, and a conductor layer 9 which coats the organic piezoelectric layer 7, and further includes an insulator layer 11 which coats the conductor layer 9 as needed. In the piezoelectric element 20, the metal foil 3 and the conductor layer 9 each function as an electrode having the organic piezoelectric layer 7 interposed therebetween (see FIG. 1(b)). Such a piezoelectric element 20 has an elongated linear form as a whole, which may be referred to as a cable shape, a wire shape, and the like, and is configured to have flexibility as the overall piezoelectric element. In the piezoelectric element 20, the core wire 5, the organic piezoelectric layer 7, the conductor layer 9, and the insulator layer 11, if present, can be arranged substantially coaxially, but the present invention is not limited to such a configuration.

The piezoelectric element 20 of the present embodiment can be manufactured in the following manner.

Figure 2:
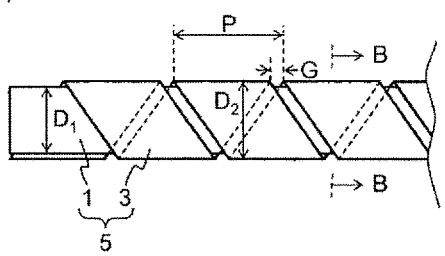
Figure 2:
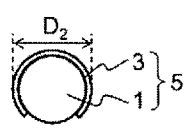
Figure 2:
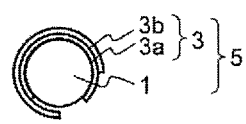

As shown in FIG. 2, the core wire 5 usable in the present embodiment only needs to have a configuration in which at least one layer of metal foil 3 is wound helically around the resin wire 1. In the core wire 5 with such a configuration, the tensile stress acts mainly on the resin wire 1 when the core wire 5 is pulled, and thereby the whole core wire 5 can be elongated. The core wire 5 can preferably exhibit a tensile elongation of 3% or more. Even when the core wire 5 is bent at a relatively small radius of curvature (for example, when the core wire 5 is subjected to a flexibility test mentioned later), no distortion remains in the core wire 5, and thus the core wire 5 exhibits excellent flexibility. Further, in the core wire 5 with such a configuration, the conduction cannot be easily cut off even after the core wire 5 is repeatedly bent (for example, the conduction can be maintained even after the core wire is repeatedly bent 5,000 times or more in a bending resistance test mentioned later), and thus the core wire 5 exhibits excellent bending resistance. Therefore, the piezoelectric element 20 of the present embodiment using such a core wire 5 can exhibit the effects of excellent flexibility and bending resistance.

The resin wire 1 only needs to be a linear member as a whole that is made of resin material. The examples of such resin material include at least one material selected from the group consisting of aromatic polyamide (aramid, such as para-aramid or meta-aramid), aliphatic polyamide (nylon), polyester, polyvinyl alcohol, polyacrylonitrile, polyarylate, polyolefin, polyurethane, and carbon fiber (for example, carbon nanotube (CNT), and the like).

The resin wire 1 can have any sectional shape, such as substantially a circular, elliptical, rectangular, or polygonal shape, can be hollow or solid, and can be a single wire, a stranded wire, a braided wire, or the like. The external dimension $D_1$ (the largest external dimension of the cross-section if the core wire has a non-circular cross-section, or the outer diameter if it has a circular cross-section, the same applies hereinafter) of the resin wire 1 is not particularly limited, and can be selected appropriately in consideration of the external dimensions desired for the core wire 5, the thickness of the metal foil 3 to be wound around the resin wire 1, and the like (in the case of two or more layers of metal foil, their total thickness). The external dimension $D_1$ of the resin wire 1 can be, for example, in the range of 0.05 to 2 mm, particularly 1 mm or less, and more particularly 0.5 mm or less.

The metal foil 3 only needs to be a foil-shaped (or a layer-shaped) member made of metal material. Any suitable metal material that exhibits high conductivity suitable for functioning as an electrode (and thus contributing to exhibit a low resistance value of the piezoelectric element as a whole) can be used as the metal material. A single metal material may be used, or a plurality of metal materials may be used (for example, a base metal of one metal material may be plated with another metal material). Preferred examples of such a metal material include copper and copper-containing alloys (such as a copper-tin alloy, and a copper-silver alloy and the like), and these metal materials may or may not have plating, such as tin, for example. These metal materials exhibit high electrical conductivity and excellent mechanical strength in addition because of high ductility of copper, and thus can further enhance the flexibility and the bending resistance of the piezoelectric element 20.

The metal foil 3 can be a single layer of metal foil or two or more layers of metal foil that overlap one another (namely, a laminate of two or more layers of metal foil). In the latter case, two or more layers of metal foil are wound helically around the resin wire 1. For example, as shown in FIG. 2(c), a metal foil 3a and a metal foil 3b can overlap one another and be wound helically around the resin wire 1. The two layers of metal foil adjacent to each other only need to overlap one another at least partially (see FIG. 2(c)), for example, by 20% or more, and particularly 40% or more of the width of the metal foil.

In a case where a laminate of two or more layers of metal foil is used as the metal foil 3, even if any one of the two or more layers of metal foil breaks due to repetitive bending or the like, for example, the entire laminate of the layers of the metal foil can avoid having its conduction cut off, thereby more effectively preventing the piezoelectric element 20 from failing. The number of layers of metal foil can be, for example, two to four, particularly three or less, and more particularly two.

The thickness and width of the metal foil 3 can be selected appropriately in consideration of the external dimension, flexibility, and bending resistance of the core wire 5 which are desired for the core wire 5. The ratio of the thickness of the metal foil 3 to the external dimension $D_1$ of the resin wire 1 can be, for example, 0.4 to 100%, and the thickness of the metal foil 3 can be, for example, 6 to 100 µm, and it can be particularly 30 µm or less, and more particularly 15 µm or less. The width of the metal foil 3 can be, for example, 0.02 to 2 mm, particularly 1 mm or less, and more particularly 0.5 mm or less. In the case of using a single layer of metal foil, the thickness of the metal foil 3 refers to the thickness of the single layer. In the case of using two or more layers of metal foil overlapping one another, the thickness of the metal foil 3 refers to the total thickness of these layers. The width of the metal foil 3 refers to the dimension of the metal foil 3 in the direction perpendicular to the center line along the longitudinal direction of the metal foil 3 (or the shortest distance between the two sides of the metal foil 3 along its longitudinal direction) that can be wound helically around the resin wire 1. When two or more layers of metal foil are used while overlapping one another, each of metal foils may have the same or different thickness and width, but these metal foils have typically the same thickness and width.

In the core wire 5, at least one layer of the metal foil 3 is wound around the resin wire 1 helically, preferably with a constant helical pitch P, and is not overlapped (does not overlap). The dimension of the helical pitch P is not particularly limited, and only needs to be greater than the width of the metal foil 3. In a state where a stress does not act on the core wire 5 (or the piezoelectric element 20), the ratio of the helical pitch P to the external dimension $D_1$ of the resin wire 1 can be, for example, 2 to 4700%, and particularly 100 to 500%. In such a range, the flexibility and the bending resistance of the core wire 5 and even the piezoelectric element 20 can be further enhanced. The helical pitch P can be, for example, 0.03 mm to 2.35 mm, and particularly 0.05 to 0.6 mm.

Further, in the core wire 5, at least one layer of metal foil 3 is wound helically around the resin wire 1 with gaps. The winding with gaps is also called interval winding, and means winding the metal foil 3 with gaps G (see FIG. 2(a)) when winding the metal foil 3 helically around the resin wire 1, as shown in FIGS. 1 and 2. Each gap G is identical to an exposed portion of the resin wire 1. The dimension of the gap G can be measured based on the exposed portion of the resin wire 1 (such a measurement method is applied particularly when two or more layers of metal foil are used overlapping one another, while these metal foils are placed with a shift from each other). In a state where a stress does not act on the core wire 5 (or the piezoelectric element 20), the ratio of the gap G to the helical pitch P can be 0.4 to 50%, and particularly 5 to 40%. In such a range, the flexibility and the bending resistance of the core wire 5 and the piezoelectric element 20 can be further enhanced. In particular, by setting the ratio of the gap G to the helical pitch P of the metal foil 3 to 0.4% or more, the flexibility and the bending resistance can be kept high owing to the elongation and contraction of the resin wire 1, while effectively preventing the ends of adjacent portions of the metal foil 3 from overlapping or contacting each other even when the piezoelectric element 20 is bent. By setting the ratio of the gap G to the helical pitch P of the metal foil 3 to 50% or less, the more area of the metal foil 3 facing the conductor layer 9 (see FIG. 1) can be secured to a certain extent, thus making it possible to realize the piezoelectric element 20 that has the elongated linear form as a whole and effectively uses the metal foil 3 and the conductor layer 9 as electrodes. The gap G can be, for example, 0.01 to 0.35 mm, and particularly 0.1 mm or less.

The external dimension D2 of the core wire 5 (the largest external dimension of the cross-section if the core wire has a non-circular cross-section, or the outer diameter if it has a circular cross-section as shown in FIG. 2(b), the same applies hereinafter) is not particularly limited and can be varied depending on the specifications required for the piezoelectric element 20. The core wire 5 can be extremely thin, and its external dimension D2 can be, for example, 0.05 to 1.5 mm, particularly 1.0 mm or less, more particularly 0.5 mm or less, and still more particularly 0.3 mm or less.

Referring again to FIG. 1, the core wire 5 is coated with the organic piezoelectric layer 7. The organic piezoelectric layer 7 is provided between the metal foil 3 of the core wire 5 and the conductor layer 9 so that the metal foil 3 and the conductor layer 9 do not contact each other, and this organic piezoelectric layer 7 is preferably provided in close contact with the metal foil 3.

The organic piezoelectric layer 7 can be composed of any material known as an organic piezoelectric body. The organic piezoelectric body has higher impact resistance and bending resistance than an inorganic piezoelectric body, typified by piezoelectric ceramics such as lead zirconate titanate (PZT), or a piezoelectric composite which is a mixture of an inorganic piezoelectric body (typified by piezoelectric ceramic) and other materials (usually an organic material). Examples of the material usable to form the organic piezoelectric layer 7 may include polyvinylidene fluoride (PVDF), a vinylidene fluoride-based copolymer (inclusive of a copolymer of vinylidene fluoride and trifluoroethylene (P(VDF/TrFE)), and a copolymer of vinylidene fluoride and tetrafluoroethylene (P(VDF/TeFE)). Among these, the organic piezoelectric layer 7 preferably contains at least one material selected from the group consisting of P(VDF/TrFE) and P(VDF/TeFE).

The thickness of the organic piezoelectric layer 7 is not particularly limited and can be selected appropriately in consideration of the piezoelectric properties (the positive piezoelectric effect and/or inverse piezoelectric effect), flexibility, bending resistance, and the like desired for the piezoelectric element 20. The thickness of the organic piezoelectric layer 7 can be, for example, 1 to 200 µm, particularly 100 µm or less, more particularly 50 µm or less.

The material forming the organic piezoelectric layer 7 can be subjected to any process necessary to develop piezoelectricity, such as stretching and/or polarization treatment, at any appropriate timing, such as before coating the core wire 5, and during and after the coating formation, depending on the material actually used.

For example, when PVDF is used as the material forming the organic piezoelectric layer 7, the organic piezoelectric layer 7 can be formed in the following manner. PVDF can have three types of crystal structures, namely, α, β, and γ-type, and usually takes α-type crystal structure which is the most energetically stable. However, PVDF that contains a large amount of α-type crystal structure can be converted into PVDF that contains a large amount of β-type crystal structure by, for example, uniaxial stretching. PVDF that contains a large amount of β-type crystal structure exhibits ferroelectricity. Such PVDF is subjected to polarization treatment, thereby aligning dipoles and exhibiting piezoelectricity. Therefore, a stretched PVDF film, which has been formed by uniaxially stretching a PVDF film, is wound around the core wire 5 with no gaps (preferably overlapped), then, by subjecting this film to polarization treatment such as corona discharge, for example, a PVDF layer exhibiting piezoelectricity can be obtained. As a result, the core wire 5 can be coated with the organic piezoelectric layer (more specifically, the PVDF layer) 7.

For example, in a case where a vinylidene fluoride-based copolymer is used as the material for the organic piezoelectric layer 7, the organic piezoelectric layer 7 can be formed in the following manner. Vinylidene fluoride-based copolymers, especially P(VDF/TrFE) and P(VDF/TeFE), can contain more β-type crystal structure than PVDF. Therefore, such a vinylidene fluoride-based copolymer needs to be subjected to only the polarization treatment without stretching, to fabricate a winding wire 7 with the core wire 5 coated with the organic piezoelectric layer 7 easily. Specifically, the organic piezoelectric layer 7 can be formed by a solvent coating method or a melt extrusion method to be mentioned later.

In the solvent coating method, a resin solution is first prepared by dissolving or dispersing a vinylidene fluoride-based copolymer in a solvent. This resin solution is then applied (for example, coated) onto the surface of the core wire 5. The solvent is substantially removed by heating this resin solution to obtain a vinylidene fluoride-based copolymer layer. Thereafter, by subjecting the vinylidene fluoride-based copolymer layer to, for example, polarization treatment, such as corona discharge, the vinylidene fluoride-based copolymer layer exhibiting piezoelectricity can be obtained. As a result, the core wire 5 can be coated with the organic piezoelectric layer (more specifically, the vinylidene fluoride-based copolymer layer) 7. Examples of the solvent include ketone-based solvents (for example, methyl ethyl ketone (MEK), methyl isobutyl ketone (MIBK), acetone, diethyl ketone, and dipropyl ketone), ester-based solvents (for example, ethyl acetate, methyl acetate, propyl acetate, butyl acetate, and ethyl lactate), ether-based solvents (for example, tetrahydrofuran, methyltetrahydrofuran, and dioxane), amide-based solvents (for example, dimethylformamide (DMF), and dimethylacetamide), pyrrolidone-based solvents (for example, N-methylpyrrolidone), and the like. The heating temperature can vary depending on the solvent used, and can be 80 to 180° C., for example.

In the melt extrusion method, for example, the vinylidene fluoride-based copolymer in the form of pellet is first heated and melted to obtain a molten resin. The heating temperature can be any temperature that is higher than or equal to a melting point of the used vinylidene fluoride-based copolymer, and can be 120 to 250° C., for example. This molten resin is applied to the surface of the core wire 5 (for example, through extrusion coating around it) to obtain a vinylidene fluoride-based copolymer layer. Thereafter, by subjecting the vinylidene fluoride-based copolymer layer to, for example, polarization treatment, such as corona discharge, the vinylidene fluoride-based copolymer layer exhibiting piezoelectricity can be obtained. As a result, the core wire 5 can be coated with the organic piezoelectric layer (more specifically, the vinylidene fluoride-based copolymer layer) 7.

The organic piezoelectric layer 7 using PVDF and/or vinylidene fluoride-based copolymer is preferred because it exhibits high heat resistance to temperatures of 85° C. or higher, for example. The molecular weights of PVDF and vinylidene fluoride-based copolymers are not particularly limited. A vinylidene fluoride-based copolymer is a copolymer of vinylidene fluoride and one or more fluorine-based monomers that can be copolymerized with vinylidene fluoride (hereinafter also simply referred to as other fluorine-based monomers). The other fluorine-based monomer can be one or both of trifluoroethylene and tetrafluoroethylene. In the vinylidene fluoride-based copolymer, the content of the unit derived from vinylidene fluoride can be 50 mole % or more, and preferably 60 mole % or more, and the molar ratio of the unit derived from the other fluorine-based monomer to the unit derived from vinylidene fluoride can be selected appropriately.

However, the material forming the organic piezoelectric layer 7 is not limited to the materials mentioned in detail above, and may further contain, for example, a relatively small amount of any suitable other components (for example, additives such as piezoelectric ceramics), or alternatively other known organic materials that exhibit piezoelectricity may be used. Particularly, in a case where the material forming the organic piezoelectric layer 7 contains a piezoelectric ceramics, the content of the piezoelectric ceramics content can be 30% by volume or less, and preferably 20% by volume or less of the organic piezoelectric layer 7.

The organic piezoelectric layer 7 is coated with the conductor layer 9. The conductor layer 9 is provided so as to at least partially coat the organic piezoelectric layer 7, and preferably provided in close contact with the organic piezoelectric layer 7.

The conductor layer 9 only needs to be a flexible member composed of a material in which at least a surface in contact with the organic piezoelectric layer 7 exhibits conductivity. The conductor layer 9 may utilize any known conductor layer as a shield and a braided shield and a transverse wound shield made from metal strands, for example, can be used. The conductor layer 9 may be at least one layer of metal foil which is wound helically around the organic piezoelectric layer 7. In this case, at least one layer of metal foil 9' can be wound helically around the organic piezoelectric layer 7, preferably with a constant helical pitch P, it may be overlapped or not overlapped, and further it may be wound with gaps, for example, as shown in FIG. 1(c). In a case where two or more layers of metal foil are used overlapping one another, the adjacent two metal foils may overlap at least partly, for example, by 20% or more, and particularly 40% or more of the width of the metal foil. Preferred examples of such a metal material forming a metal strand or metal foil include copper and copper-containing alloys (for example, a copper-tin alloy, a copper-silver alloy, and the like), and these metal materials may or may not have plating, such as tin, for example. These metal materials exhibit high electrical conductivity and further excellent mechanical strength because of high ductility of copper, and thus can further enhance the flexibility and the bending resistance of the piezoelectric element 20.

The thickness of the conductor layer 9 is not particularly limited and can be selected appropriately in consideration of the flexibility, the bending resistance, and the like desired for the piezoelectric element 20. The thickness of the conductor layer 9 can be, for example, 5 to 500 μm, and it can be particularly 200 μm or less, and more particularly 100 μm or less.

The external dimension of the conductor layer 9 can match the external dimension of the piezoelectric element 20 when the piezoelectric element 20 does not have the insulator layer 11. The external dimension is not particularly limited, and can be, for example, 0.05 to 2.2 mm, particularly 1.5 mm or less, and more particularly 1 mm or less.

Furthermore, such a conductor layer 9 can be coated with the insulator layer 11, even though this configuration is not essential for the present embodiment. The insulator layer 11 may be provided to electrically and/or physically protect the piezoelectric element 20. Such an insulator layer 11 can also be understood as a sheath (or outer shell).

The insulator layer 11 only needs to be a flexible member composed of a material whose surface is at least made of a material exhibiting insulating properties. The insulator layer 11 may be, for example, a braid of insulating strands (for example, strands made of insulating materials, such as nylon, polyester, acryl, polyolefin, rubber, silicone, urethane, polyarylate, aromatic polyamide, aliphatic polyamide, and the like). The insulator layer 11 may be formed by extrusion coating, around the conductor layer 9, of an insulating material (for example, polyethylene, polyvinyl chloride, ethylene-vinyl acetate copolymer (EVA), polyolefin, fluorine resin (tetrafluoroetylene-perfluoroalkylvinylether copolymer (PFA), tetrafluoroethylene-hexafluoropropylene copolymer (FEP), tetrafluoroethylene-ethylene copolymer (ETFE), PVDF, and the like), rubber, and the like).

The thickness of the insulator layer 11 is not particularly limited and can be selected appropriately in consideration of the flexibility, the bending resistance, and the like desired for the piezoelectric element 20. The thickness of the insulator layer 11 can be, for example, 10 to 1,000 μm, and it can be particularly 700 μm or less, and more particularly 400 μm or less.

The external dimension of the insulator layer 11 can match the external dimension of the piezoelectric element 20 when the piezoelectric element 20 has the insulator layer 11. This external dimension is not particularly limited, and can be, for example, 0.07 to 4.2 mm, particularly 1.5 mm or less, and more particularly 1 mm or less.

An air layer may be at least partially present between the conductor layer 9 and the insulator layer 11. In this case, the insulator layer 11 can be easily removed using a wire stripper or the like to expose the conductor layer 9 and take out electrode terminals.

The piezoelectric element 20 of the present embodiment can be obtained in the above-mentioned manner. The piezoelectric element 20 of the present embodiment has excellent flexibility and bending resistance. The metal foil 3 and the conductor layer 9 function as the electrodes (in the appending drawings, the electrode terminals are shown schematically by black circles). The conductor layer 9 may be a ground. In that case, the conductor layer 9 can also function as a shield.

The piezoelectric element 20 of the present embodiment can be utilized as various sensors and/or actuators.

The piezoelectric element 20 of the present embodiment can be utilized as a sensor using the positive piezoelectric effect of the piezoelectric body. The piezoelectric element 20 can be mounted and/or embedded in an object to be detected, for example. The piezoelectric element 20 can be utilized as a pressure-sensitive sensor capable of detecting an external force when it is applied to the piezoelectric element 20, or as a sensor that detects internal fatigue of an object to be detected. A plurality of piezoelectric elements 20 can also be used to construct a knitted or woven fabric, which can be utilized as a fibrous piezoelectric sensor or a vibration power generation element. The piezoelectric element 20 can be further utilized in various applications, such as security sensors, nursing/watching sensors, shock sensors, wearable sensors, bio-signal sensors (respiration/pulse), vehicle pinch prevention sensors, vehicle bumper collision sensors, vehicle air flow sensors, weather detection sensors (rain/snow), fire detection sensors, underwater acoustic sensors, tactile sensors for robots, tactile sensors for medical equipment, fiber sheet pressure distribution sensors, and power generation wires for environmental vibration, for example.

Instead of/in addition to the above, the piezoelectric element 20 of the present embodiment can be utilized as an actuator using the inverse piezoelectric effect of the piezoelectric body. For example, the piezoelectric element 20 can be utilized as an actuator that excites vibration when a drive voltage is applied to the piezoelectric element 20, and furthermore, it can also be utilized as an actuator drive sensor using its vibration as a sensor. In addition to the above applications, the piezoelectric element 20 can also be utilized in various other applications, such as robot joint drive actuators, artificial muscle actuators, drive actuators for medical equipment operating wires, drive actuators for fiberscopes, ultrasonic motors, and piezoelectric motors, for example.

While the piezoelectric element in one embodiment of the present invention has been described in detail above, the present embodiment can be modified variously.

EXAMPLES

Example 1

A piezoelectric element having the configuration mentioned in detail in the first embodiment with reference to FIGS. 1 and 2 was fabricated in the following manner.

A stranded wire of about 0.15 mm in diameter was used as the resin wire 1, wherein the stranded wire was composed of 50 strands of para-aramid fibers, and wherein each strand had a diameter of 15 Nm. Then, a laminate composed of two layers of foil as the metal foil 3, which was made of a copper-tin alloy with tin plating, was wound around the resin wire 1 with gaps to thereby prepare the core wire 5. Each foil had a width of about 0.17 mm, and the total thickness of the laminate was about 0.012 mm. The outer diameter of the core wire 5 was about 0.17 mm, the pitch P thereof was about 0.27 mm, and the gap G thereof was about 0.08 mm (G/P=about 30%).

Meanwhile, 33 g of a vinylidene fluoride-tetrafluoroethylene copolymer was dissolved in 67 g of methyl ethyl ketone at 70° C. while heating, and then the mixture was stirred with an ultrasonic homogenizer, "BRANSON Digital Sonifier" manufactured by Emerson Japan, Ltd., for 30 minutes, thereby preparing a resin solution.

The core wire 5 prepared in the way above was coated with the above-mentioned resin solution by a dip coating method and then heated at 150° C. for two minutes to vaporize and remove methyl ethyl ketone, thereby forming a vinylidene fluoride-tetrafluoroethylene copolymer layer on the surface of the core wire 5. The vinylidene fluoride-tetrafluoroethylene copolymer layer was subjected to polarization treatment by corona discharge at a DC voltage of 12 kV for 30 seconds using a DC high-voltage stabilized power supply (manufactured by Element Co., Ltd.) with the core wire 5 as the ground electrode to thereby obtain the organic piezoelectric layer 7. The thickness of the organic piezoelectric layer 7 was about 40 µm.

Next, a single layer of foil made of a tin-copper alloy with tin plating was helically wound as the conductor layer 9 around the periphery of the organic piezoelectric layer 7 (with no gaps), whereby the organic piezoelectric layer 7 was coated with the conductor layer 9. The thickness of the conductor layer 9 was about 0.012 mm.

Then, low density polyethylene was extruded to coat the periphery of the conductor layer 9, thereby forming the insulator layer 11. The thickness of the insulator layer 11 was about 200 µm. The outer diameter of the insulator layer 11 (namely the outer diameter of the piezoelectric element 20) was about 0.67 mm.

The piezoelectric element 20 of this example was fabricated in the above-mentioned manner.

Example 2

A stranded wire of about 0.14 mm in diameter was used as the resin wire 1, wherein the stranded wire was composed of 50 strands of para-aramid fibers, and wherein each strand had a diameter of about 14 µm. Then, a laminate composed of two layers of foil as the metal foil 3, which was made of a copper-silver alloy, was wound around the resin wire 1 with gaps to thereby prepare the core wire 5. Each layer of foil had a width of about 0.17 mm, and the total thickness of the laminate was about 0.012 mm. The outer diameter of the core wire 5 was about 0.16 mm, the pitch P thereof was about 0.34 mm, and the gap G thereof was about 0.04 mm (G/P=about 12%).

A piezoelectric element was fabricated in the same manner as in Example 1 except for the use of the core wire prepared in the way above.

Example 3

A stranded wire of about 0.15 mm in diameter was used as the resin wire 1, wherein the stranded wire was composed of 50 strands of polyester, each strand and wherein each strand had a diameter of about 15 µm. Then, a single layer of foil as the metal foil 3, which was made of a copper-tin alloy, was wound around the resin wire 1 with gaps to thereby prepare the core wire 5. The foil had a width of about 0.27 mm and a thickness of about 0.019 mm. The outer diameter of the core wire 5 was about 0.19 mm, the pitch P thereof was about 0.23 mm, and the gap G thereof was about 0.02 mm (G/P=about 9%).

A piezoelectric element was fabricated in the same manner as in Example 1 except for the use of the core wire prepared in the way above.

Comparative Example 1

A piezoelectric element was fabricated in the same manner as in Example 1 except for the use of a nylon yarn with a silver-plated surface (outer diameter of about 0.11 mm, manufactured by Mitsufuji Corporation, product name: AGposs (registered trademark) silver-plated fiber (filament), 70d/34f, note that d means denier and f means the number of filaments) as the core wire.

Comparative Example 2

A piezoelectric element was fabricated in the same manner as in Example 1 except for the use of a nylon yarn with a silver-plated surface (outer diameter of about 0.16 mm, manufactured by Mitsufuji Corporation, product name: AGposs (registered trademark) silver-plated fiber (filament), 100d/34f) as the core wire.

Comparative Example 3

A piezoelectric element was fabricated in the same manner as in Example 1 except for the use of a single high-tension piano wire with a brass-plated surface (outer diameter of about 0.05 mm, manufactured by Nippon Steel & Sumikin SG Wire Co., Ltd., product name: SPWH) as the core wire.

Comparative Example 4

A piezoelectric element was fabricated in the same manner as in Example 1 except for the use of a stranded wire (outer diameter of about 0.075 mm) composed of seven strands of a copper-tin alloy with a silver-plated surface as the core wire.

Comparative Example 5

A piezoelectric element was fabricated in the same manner as in Example 1 except for the use of a single wire (outer diameter of about 0.06 mm) of SUS316 (JIS G4309) as the core wire.

(Measurement and Evaluation)

The resistance value and tensile elongation of each of the piezoelectric elements fabricated in Examples 1 to 3 and Comparative Examples 1 to 5 were measured in the following manner, and these piezoelectric elements were subjected to and evaluated in a flexibility test and a bending resistance test. The results are shown in Table 1.

Resistance Value Measurement

A part of the metal foil (Examples) or a metal portion (Comparative Examples) of the core wire as well as a part of the conductor layer were exposed from the piezoelectric element to form electrodes. A resistance value of the piezoelectric element was measured using a tester (manufactured by Custom Inc., Digital Multimeter CDM-11D) by applying a voltage between these electrodes.

To make the piezoelectric element withstand practical use, the lower resistance value is preferable. Specifically, the resistance value is preferably 50 Ω/m or less, and more preferably 20 Ω/m or less.

Tensile Elongation Measurement

The piezoelectric element cut so as to have a length of about 100 mm was pulled at 10 mm/min using a tensile testing machine (manufactured by Shimadzu Corporation, model number: AGS-H) in accordance with JIS Z2241 while grabbing both ends in the longitudinal direction of the piezoelectric element with a grab tool. The length of the piezoelectric element at the time of the break of the piezoelectric element was measured, and then the ratio (%) of the elongation of the piezoelectric element at the time of the break to the length of the piezoelectric element before the test was determined (tensile elongation means the same as elongation at break).

To contribute to the flexibility of the piezoelectric element, the greater tensile elongation is preferable. Specifically, the tensile elongation is preferably 3% or more.

Flexibility Test

A long piezoelectric element was bent and crossed to form a ring with an inner diameter of 10 mm. Then, both ends in the longitudinal direction of the piezoelectric element were pulled in opposite directions such that its ring shrinks while maintaining the crossed portions as much as possible not to untie the ring. Then, it was determined whether distortion remained in the piezoelectric element (more specifically, the core wire), by visual observation.

To make the piezoelectric element withstand practical use, it is preferable that no distortion remains.

Bending Resistance Test

The piezoelectric element was repeatedly bent by ±90° with a load of 100 g at a speed of 60 rpm, using a durability tester (manufactured by Yuasa System Co., Ltd., model number: DMLHB-P150), and then the number of times until the conduction between the electrodes of the piezoelectric element was cut off was measured.

To make the piezoelectric element withstand practical use, it is preferable that the piezoelectric element can maintain the conduction even after it is repeatedly bent 5,000 times or more. It is more preferable that the piezoelectric element can maintain the conduction even after it is repeatedly bent 10,000 times or more.

TABLE 1

|  | Resistance value ($\Omega$/m) | Tensile elongation (%) | Flexibility test (residual distortion) | Bending resistance test (number of bending) |
|---|---|---|---|---|
| Example 1 | 14.0 | 5.7 | Absence | 15,502 |
| Example 2 | 10.7 | 5.0 | Absence | 15,831 |
| Example 3 | 10.6 | 20.0 | Absence | 6,201 |
| Comparative Example1 | 328 | 29.3 | Absence | 5,476 |
| Comparative Example2 | 98 | 35.0 | Absence | 6,018 |
| Comparative Example3 | 6.4 | 2.4 | Presence | 2,688 |
| Comparative Example4 | 3.9 | 1.3 | Presence | 869 |
| Comparative Example5 | 1.7 | 2.0 | Presence | 1,994 |

As can be understood from Table 1, the piezoelectric elements of Examples 1 to 3 exhibited low resistance values of 50 $\Omega$/m or less, tensile elongation of 3% or more, and excellent flexibility with no residual distortion when subjected to the flexibility test. This is considered to be because a bending stress acted mainly on the resin wire of the core wire and not directly on the metal foil, so that the piezoelectric element was able to return to its original state even when it was deformed due to elastic deformation of the resin wire. Further, the piezoelectric elements of Examples 1 to 3 were able to maintain the conduction even after they were repeatedly bent 5,000 times or more in the bending resistance test, and thus exhibited excellent bending resistance. Especially, the piezoelectric elements of Examples 1 and 2 were able to maintain the conduction even after they were repeatedly bent 15,000 times or more in the bending resistance test, thereby exhibiting extremely excellent bending resistance. This is considered to be because, as the core wire used a laminate of two or more layers of metal foil, the entire laminate of the layers of the metal foil was able to avoid cutting off the conduction even when either of two layers of metal foil broke due to the repetitive bending. On the other hands, the piezoelectric elements of Comparative Examples 1 and 2 had high resistance values and were not suitable for practical use. The piezoelectric elements of Comparative Examples 3 to 5 had tensile elongation of less than 3% and the distortion in their core wires remained in the flexibility test. It was considered that the reason for the residual distortion was that a bending stress acted directly on the metal portion of the core wire, causing plastic deformation of the metal, and thus the piezoelectric elements were not able to return to their original state. Further, in the piezoelectric elements of Comparative Examples 3 to 5, the conduction was cut off after they were repeatedly bent less than 5,000 times in the bending resistance test. This was considered to be because a bending stress acted directly on the metal portion of the core wire, whereby the piezoelectric element was easily broken due to accumulation of plastic deformation of the metal.

(Operation Confirmation)

The operation of the piezoelectric element fabricated in Example 1 was confirmed by the following procedure.

Electrodes were taken out from the metal foil 3 of the core wire 5 and the conductor layer 9 in the piezoelectric element 20, and then connected to an impedance conversion circuit. The purpose of the impedance conversion circuit was to reduce an output impedance from the piezoelectric element with high impedance. This impedance conversion circuit may be a circuit constituted of, for example, a field-effect transistor (FET), a capacitor, a resistor and the like. An operation check system was configured such that a voltage signal output from the piezoelectric element 20 through the impedance conversion circuit could be measured over time by an oscilloscope.

Figure 3:
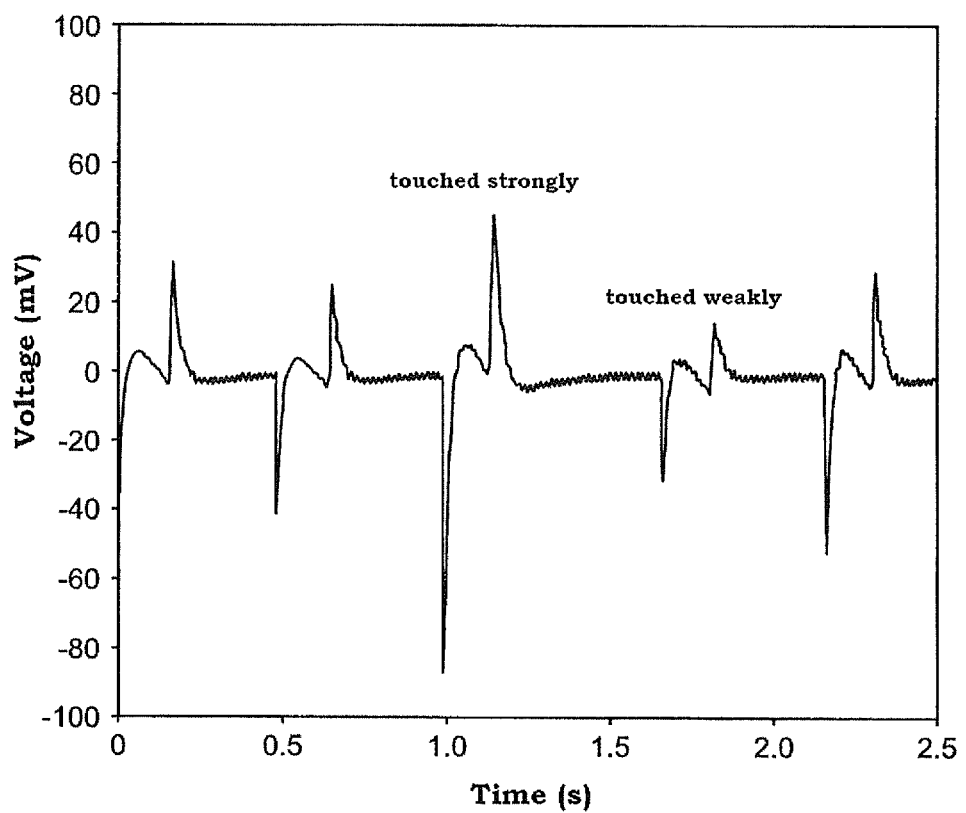
FIG. 3 is a graph of changes in voltage signal over time, showing an example of the output from a piezoelectric element in an example of the present invention.

While measuring the voltage signal from the piezoelectric element as mentioned above, the piezoelectric element was touched strongly or weakly with a fingertip. The graph of changes in the voltage signal over time at this time is shown in FIG. 3. As shown in FIG. 3, when the external force was applied to the piezoelectric element by touching it, a negative voltage was generated, and an increase in the voltage value on the negative side was observed, whereas when the external force was released, an opposite voltage, that is, a positive voltage was generated, and an increase in the voltage value on the positive side was observed. Further, the voltage value peak varied depending on the magnitude of the applied external force. The greater the applied external force was, the higher the voltage value peak became.

Figure 4:
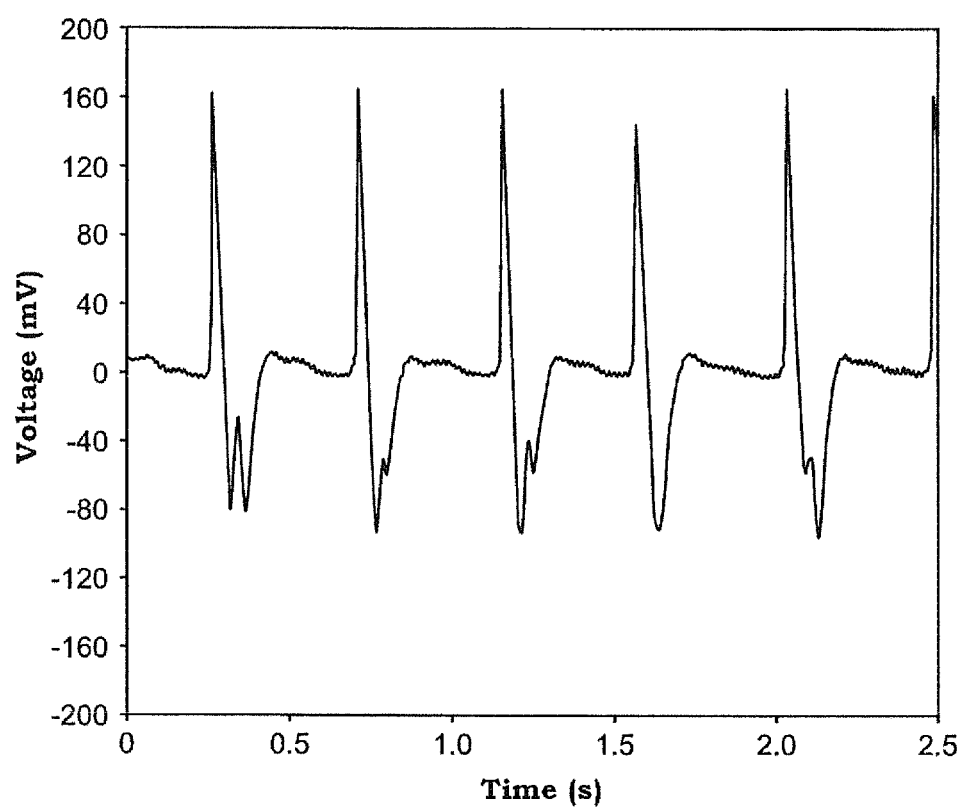
FIG. 4 is a graph of changes in voltage signal over time, showing another example of the output from the piezoelectric element in the example of the present invention.

Furthermore, the graph of changes in voltage signal over time obtained when the piezoelectric element was pinched in two sites with fingers and repeatedly pulled lightly in opposite directions is shown in FIG. 4. The graph of changes in the voltage signal over time obtained when the piezoelectric element was held with a fingertip and twisted rightward twice and then leftward twice is shown in FIG. 5.

Figure 5:
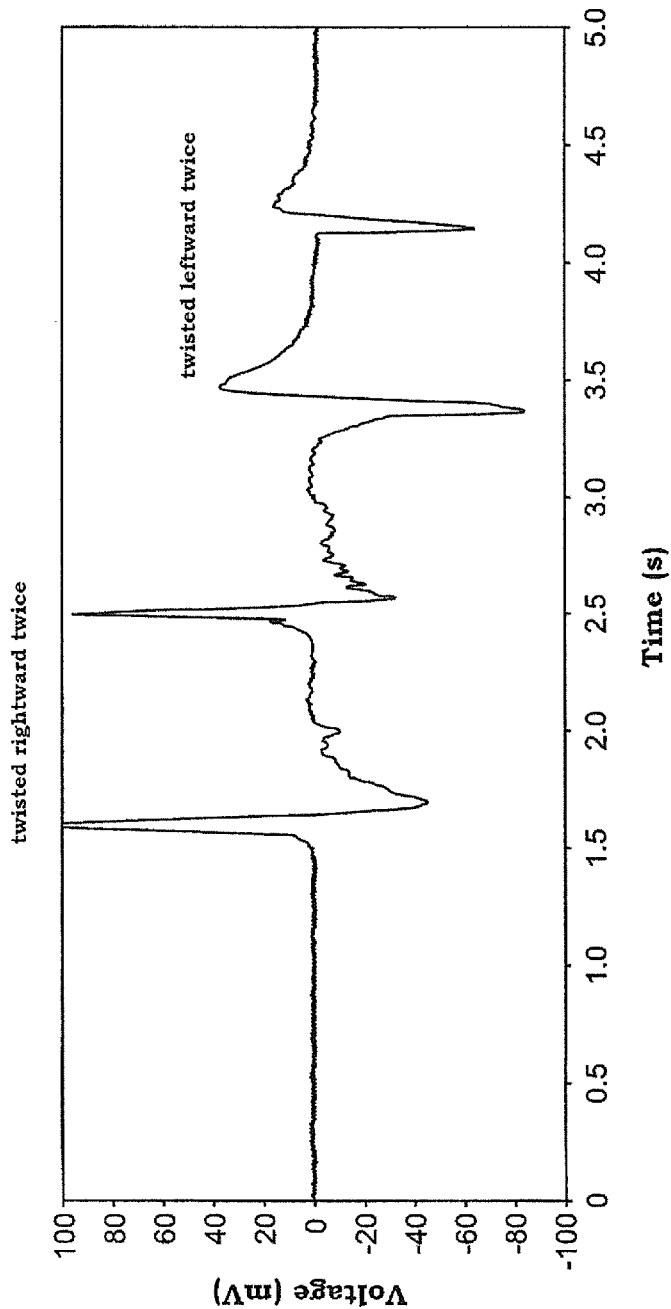
FIG. 5 is a graph of changes in voltage signal over time, showing a further example of the output from the piezoelectric element in the example of the present invention.

As can be understood from FIGS. 3 to 5, in all cases, it was confirmed that the piezoelectric element of Example 1 sensitively detected external force applied from the finger and thus could actually function as a piezoelectric element. It is noted that the waveform of the voltage signal varied depending on the way of the application of the external force (touching, pulling, or twisting).

INDUSTRIAL APPLICABILITY

The piezoelectric element of the present invention can be utilized as various sensors and/or actuators. Although not intended to limit the present invention, the piezoelectric element of the present invention has excellent flexibility and bending resistance, can have an extremely elongated external dimension, and can be utilized, for example, as a pressure-sensitive sensor capable of detecting an external force when the force is applied to the piezoelectric element.

This application claims priority to and the benefit of Japanese Patent Application No. 2018-167231, filed Sep. 6, 2018, the entire contents of which are incorporated herein by reference.

REFERENCE SIGNS LIST

1 Resin wire
3, 3a, 3b Metal foil
5 Core wire
7 Organic piezoelectric layer
9 Conductor layer
11 Insulator layer
20 Piezoelectric element
$D_1$, $D_2$ External dimension
P Helical pitch
G Gap

The invention claimed is:

1. A piezoelectric element comprising
a core wire which is formed by winding at least one layer of metal foil helically around a resin wire,
an organic piezoelectric layer which coats the core wire, and
a conductor layer which coats the organic piezoelectric layer,
wherein the metal foil and the conductor layer each function as an electrode having the organic piezoelectric layer interposed therebetween, the at least one layer of metal foil is helically wound around the resin wire with gaps, and the ratio of the gap to the helical pitch of the metal foil is 0.4% to 50%.

2. The piezoelectric element according to claim 1, wherein two or more layers of metal foil is helically wound around the resin wire.

3. The piezoelectric element according to claim 1, wherein the resin wire is composed of at least one material selected from the group consisting of aromatic polyamide, aliphatic polyamide, polyester, polyvinyl alcohol, polyacrylonitrile, polyarylate, polyolefin, polyurethane, and carbon fiber.

4. The piezoelectric element according to claim 1, wherein the metal foil has a thickness of 6 to 100 μm and a width of 0.02 to 2 mm.

5. The piezoelectric element according to claim 1, wherein the core wire has an outer size of 0.05 to 1.5 mm.

6. The piezoelectric element according to claim 1, wherein the organic piezoelectric layer has a thickness of 1 to 200 μm.

7. The piezoelectric element according to claim 1, wherein the organic piezoelectric layer comprises at least one selected from the group consisting of copolymer of vinylidene fluoride and trifluoroethylene, and copolymer of vinylidene fluoride and tetrafluoroethylene.

8. The piezoelectric element according to claim 1, further comprising an insulator layer which coats the conductor layer.

9. The piezoelectric element according to claim 1, the piezoelectric element is used as a sensor or an actuator, or both of them.

* * * * *